Figure 1:
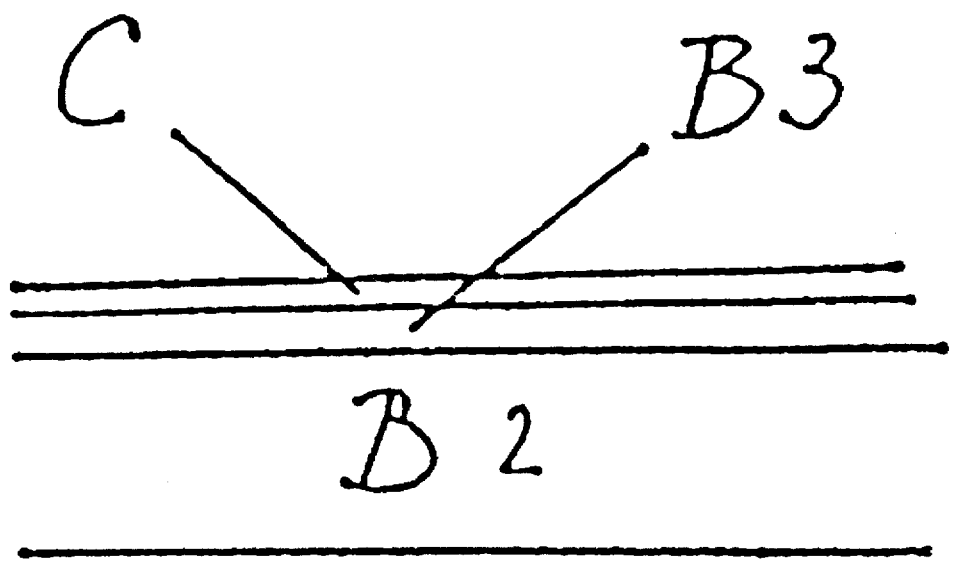

United States Patent [19]

Ederyd et al.

[11] Patent Number: 5,718,948
[45] Date of Patent: Feb. 17, 1998

[54] CEMENTED CARBIDE BODY FOR ROCK DRILLING MINERAL CUTTING AND HIGHWAY ENGINEERING

[75] Inventors: Stefan S. O. Ederyd, Sakajo-Boo; E. K. Staffen Söderberg, Huddinge; Udo K. R. Fischer, Vällingby, all of Sweden

[73] Assignee: Sandvik AB, Sandviken, Sweden

[21] Appl. No.: 214,157

[22] Filed: Mar. 17, 1994

Related U.S. Application Data

[63] Continuation of Ser. No. 715,655, Jun. 14, 1991, abandoned.

[30] Foreign Application Priority Data

Jun. 15, 1990 [SE] Sweden .................. 9002136

[51] Int. Cl.$^6$ .................. C23C 16/02; C23C 16/26
[52] U.S. Cl. .................. 427/249; 427/562; 427/566; 427/577; 427/582; 427/585; 427/586; 427/590; 427/596; 428/552
[58] Field of Search .................. 428/539.5, 569, 428/551, 552; 75/236, 240; 427/577, 590, 249, 566, 596, 562, 582, 585, 586

[56] References Cited

U.S. PATENT DOCUMENTS

| | | | |
|---|---|---|---|
| 2,941,248 | 6/1960 | Hall | 18/16.5 |
| 3,141,746 | 7/1964 | De Lai | 51/307 |
| 3,757,878 | 9/1973 | Wilder et al. | 175/329 |
| 3,757,897 | 9/1973 | Wilder et al. | 175/329 |
| 4,101,703 | 7/1978 | Schintlmeister et al. | 428/216 |
| 4,109,737 | 8/1978 | Bovenkerk | 175/329 |
| 4,148,368 | 4/1979 | Evans | 175/329 |
| 4,274,840 | 6/1981 | Housman | 175/329 X |
| 4,531,595 | 7/1985 | Housman | 175/329 |
| 4,592,433 | 6/1986 | Dennis | 76/329 |
| 4,593,776 | 6/1986 | Salesky | 175/375 |
| 4,694,918 | 9/1987 | Hall | 175/329 |
| 4,707,384 | 11/1987 | Schachner et al. | 427/249 |
| 4,714,625 | 12/1987 | Chopra et al. | 427/35 |
| 4,718,505 | 1/1988 | Fuller | 175/329 |
| 4,731,296 | 3/1988 | Kikuchi et al. | 428/552 |
| 4,743,515 | 5/1988 | Fischer et al. | 428/698 |
| 4,751,972 | 6/1988 | Jones et al. | 175/329 |
| 4,764,434 | 8/1988 | Aronsson et al. | 428/565 |
| 4,766,040 | 8/1988 | Hillert et al. | 428/552 |
| 4,784,023 | 11/1988 | Dennis | 76/108 |
| 4,811,801 | 3/1989 | Salesky et al. | 175/329 |
| 4,819,516 | 4/1989 | Dennis | 76/101 |
| 4,820,482 | 4/1989 | Fischer et al. | 419/15 |
| 4,843,039 | 6/1989 | Akesson et al. | 501/87 |
| 4,858,707 | 8/1989 | Jones et al. | 175/329 |
| 4,871,377 | 10/1989 | Frushour | 51/309 |
| 4,889,017 | 12/1989 | Fuller et al. | 76/108 A |
| 4,919,974 | 4/1990 | McCune et al. | 427/249 |
| 4,948,629 | 8/1990 | Hacker et al. | 427/53.1 |
| 4,961,958 | 10/1990 | Desphandey et al. | 427/38 |
| 4,972,637 | 11/1990 | Dyer | 51/295 |
| 4,988,421 | 1/1991 | Drawl et al. | 204/192.3 |
| 5,007,207 | 4/1991 | Phaal | 51/204 |
| 5,068,148 | 11/1991 | Nakahura | 428/335 |
| 5,074,623 | 12/1991 | Hedlund et al. | 299/79 |
| 5,112,458 | 5/1992 | Nakayama et al. | 204/173 |
| 5,154,245 | 10/1992 | Waldenström et al. | 175/420.2 |

FOREIGN PATENT DOCUMENTS

| 272418 | 6/1988 | European Pat. Off. |
| 2138864 | 10/1984 | United Kingdom |

*Primary Examiner*—Kathryn L. Gorgos
*Assistant Examiner*—Chrisman D. Carroll
*Attorney, Agent, or Firm*—Burns, Doane, Swecker & Mathis, L.L.P.

[57] ABSTRACT

The invention relates to a coated cemented carbide body for rock drilling having a substrate containing at least one metal carbide and a binder metal and an at least partly covering coating comprising at least one diamond- or cBN-layer applied by CVD- or PVD-technique. The cemented carbide body has a core of cemented carbide containing eta-phase surrounded by a surface zone of cemented carbide free of eta-phase.

17 Claims, 1 Drawing Sheet

CEMENTED CARBIDE BODY FOR ROCK DRILLING MINERAL CUTTING AND HIGHWAY ENGINEERING

This application is a continuation of application Ser. No. 07/715,655, filed Jun. 14, 1991 now abandoned.

The present invention relates to a cemented carbide body provided with a diamond coating applied by CVD- or PVD-technique to be used in tools for drilling of rock and mineral. The cemented carbide body has an eta-phase containing core surrounded by a zone free of eta-phase.

Much effort has been devoted to improving both the wear resistance and the toughness of cemented carbide bodies. The wear resistance is important to prevent the inserts from simply wearing away during rock drilling. Toughness is important to avoid inserts breaking off due to the high impact loads experienced in drilling.

In EP-A-0182759 (U.S. Pat. No. 4,743,515), it has been shown that an increased strength was obtained in sintered bodies of cemented carbide being used in tools for rock drilling, but also in wear parts by manufacturing said sintered body so that its core comprises a fine-grained eta-phase, $M_6C$ (e.g., $CO_3W_3C$) and/or $M_{12}C$ (e.g., $Co_6W_6C$), embedded in normal alpha (WC)+beta (Co binder phase) structure at the same time as the sintered body has a surrounding surface zone which consists only of alpha+beta-phase. Furthermore, said surface zone has an outer part with low content of beta-phase (binder phase), and an inner part—between the outer part and the eta-phase containing core—which has a high content of binder phase.

In the European patent application EP 87850142 (U.S. Pat. No. 4,843,039), it has been shown that the above-mentioned structure in cemented carbide cutting tool inserts have shown highly improved cutting performance in chip-forming machining, milling and turning, compared to conventional cemented carbide cutting inserts. Inserts according to said invention may further be coated with one or more wear resistant layers. Such layers may include diamond and/or cubic boron nitride (cBN).

Diamond and cubic boron nitride coatings can be applied on cemented carbide bodies by sintering in the area of high temperature and high pressure in which diamond or cBN are stable. Such coatings are often referred to as high pressure coatings.

Another, more recent, development of cemented carbide bodies for rock drilling and chipforming machining, has been the use of diamond coatings deposited by CVD or PVD-technique at low pressure on such bodies. This low pressure synthesis of diamond coatings from vapor phase using a gas mixture of hydrogen and a hydrocarbon was first reported in 1977 by Derjaguin and his co-workers in Moscow. Their findings were later confirmed by a team of Japanese scientists and their first publications in 1982-1983 marked the onset of an intense worldwide research effort in CVD diamond synthesis. It has now been shown that high quality diamond coatings can be grown on a wide range of substrates by a number of different deposition techniques. The growth rate, microstructure and properties of the diamond coating can be controlled by variation of the process parameters, in particular by the use of different gas mixtures, which may include compounds containing not only oxygen, nitrogen, boron and/or halogenes, but also different inert gas additions. The amount of papers, patents and patent applications in the area in question numbers in the thousands. U.S. Pat. No. 4,707,384 is a relatively old patent which, in addition, contains a reference list of the early work in CVD diamond. Some of the more recent patent publications are U.S. Pat. No. 4,731,296 and EP 272 418, just to mention a few.

The CVD diamond deposition process and the resulting coating adhesion are both strongly influenced by the surface characteristics of the substrate. Formation of voids and non-diamond material at the coating/substrate interface in combination with high compressive stresses in the coating are believed to be the main reason for poor adhesion. Formation of high residual stresses (compressive) is partly due to the low coefficient of thermal expansion of diamond.

Surprisingly, it has now been found that cemented carbide bodies manufactured in such a way that they contain a core of cemented carbide containing eta-phase surrounded by a zone free of eta-phase with a coating of diamond applied by CVD- or PVD-technique show highly improved wear resistance and toughness in rock drilling applications compared with conventional diamond coated cemented carbide bodies.

FIG. 1 shows a cross-section of a cemented carbide body according to the present invention. In this drawing, A means cemented carbide comprising alpha-, beta- and eta-phase, B(=B1+B2) means cemented carbide containing alpha- and beta-phase, B3 is a possible intermediate layer and C is the diamond coating.

According to the invention, there is now provided a coated cemented carbide body for rockdrilling having a substrate containing at least one metal carbide and a binder metal and being at least partly covered by a coating comprising at least one diamond -or cBN- layer deposited by CVD- or PVD-methods, the cemented carbide body having a core containing eta-phase and a surface zone free of eta-phase. The diamond layer(s) is/are deposited by low pressure technique, preferably CVD-technique. Several diamond layers may be separated by non-diamond layers including refractory metals such as W, Ta, Zr and Mo, other pure elements such as B and Si, carbides such as WC, SiC, $B_4C$ and TaC, nitrides such as $Si_3N_4$ and cBN, oxides and/or borides. cBN interlayers applied by high pressure and high temperature are also included. In order to increase the adhesion of the innermost diamond layer to the substrate, there may be one or more non-diamond interlayers, B3, between the substrate and the diamond layer. The outermost layer may be a diamond layer or a non-diamond layer.

The cemented carbide body shall have a core, A, comprising alpha, beta, eta and possibly gamma phase. The eta-phase in the core shall be finely distributed, usually with a grain size of 0.5-20 µm, preferably 1-10 µm, and the content of eta-phase shall be at least 2% by volume, preferably at least 10% by volume, but at the most, 60% by volume, preferably maximally 35% by volume. The thickness of the eta-phase-containing core A shall be 10-95%, preferably 30-65%, of the width of the cemented carbide body to make good results obtainable. In a preferred embodiment, the zones free of eta-phase shall have a content of binder phase (i.e., in general, cobalt), in zone B2 of 0.1-0.9, preferably 0.2-0.7, the nominal content of the binder phase, and the binder phase content shall increase in the direction towards the core, up to a maximum of at least 1.2, preferably 1.4-2.5, of the nominal content of the binder phase. The width of the zone with reduced binder phase content, B2, shall be 0.2-0.8, preferably 0.3-0.7, the width of the zone free of eta-phase (B1 and B2) but at least 0.4 mm and preferably at least 0.8 mm.

The binder phase in the surface zone of the cemented carbide body may be removed before the diamond coating is deposited by chemical or electrolytical etching, by ion etching, by mechanical treatment such as blasting, by heat treatment under slightly decarburizing conditions or in vacuum. The cemented carbide may, in addition, contain <5% by weight of other cubic carbides, whiskers of refractory material or coated or uncoated particles of other hard refractory material, such as SiC, $TiB_2$, etc., or mixtures thereof.

The diamond layer can be deposited according to CVD- or PVD-methods known in the art, such as hot filament, DC, RF and MW plasmas, hollow cathode and arc jet discharges (DC, RF and MW), flame torch, etc.

In order to improve the properties of the diamond coating dopants such as boron may be added during the deposition to increase the thermal stability.

The reason for the improvement of the properties of the diamond coated cemented carbide body, according to the invention, is believed to be a favorable stress condition as a result of the eta-phase containing core and the binder phase distribution in the zone free of eta-phase. This favorable stress pattern is the result of the lower content of binder phase in the outer part of the zone free of eta-phase in relation to the inner part, which leads to the formation of compressive stresses in the cemented carbide in the zone nearest to the coating interface. This has a positive effect upon the strength and the toughness of the composite body. The reduced coefficient of thermal expansion in the surface zone of the cemented carbide due to its high content of hard constituents also leads to an improved thermal matching between the coating and cemented carbide body. An increase of the thermoshock resistance is also obtained which results in a reduction of the initiation and growth of thermal cracks. This can be explained by the different levels of thermal expansion of the two zones in the part free of eta-phase. The outer binder phase depleted zone has a smaller thermal expansion than the inner one rich in binder phase.

Tools according to the invention can be used for percussive, rotary crushing and cutting rock drilling. Tools for cutting of asphalt are also included. More particularly, the invention relates to the field of roller cone type bits and percussion type bits. The invention is particularly useful in tools for oil and gas drilling, geothermal drilling, pilot hole drilling, blast hole drilling, etc., as well as in bits for drilling in oil and gas applications, methane drainage, etc.

The invention has been described with reference to diamond coatings, but the invention can also be applied to cBN- coatings deposited by CVD- or PVD-methods.

The invention is additionally illustrated in connection with the following Examples which are to be considered as illustrative of the present invention. It should be understood, however, that the invention is not limited to the specific details of the Examples.

EXAMPLE 1

A diamond coating was deposited directly on cemented carbide buttons for percussive rock drilling using a tantalum hot filament reactor, equipped with an additional heating furnace. The nominal composition of the cemented carbide was 6% Co and 94% WC and with an eta-phase containing core surrounded by a surface zone free of eta-phase with a low cobalt content (3%) at the surface and a higher Co-content in a zone close to the eta-phase core. For comparative purposes, buttons with the same nominal composition with homogeneous structure and no eta-phase were also coated. The deposition conditions were as follows:

Gas composition: 0.8% methane in hydrogen
Pressure: 20 Torr
Gas flow rate: 2000 ml/min
Furnace temperature: 800° C.
Deposition time: 40 h
Filament temperature: 2000° C.

A well-faceted, crystalline coating of 25–30 μm thickness was obtained.

EXAMPLE 2

A diamond coating was deposited on buttons for percussive rock drilling according to Example 1, but with a 4 μm coating of tungsten as an intermediate layer. The tungsten layer was deposited using standard CVD-technique using a gas mixture of $WF_6$, $H_2$ and Ar. Diamond deposition conditions were in this example:

Gas composition: 0.8% ethanol in hydrogen
Pressure: 15 Torr
Gas flow rate: 4 l/min
Furnace temperature: 865° C.
Deposition time: 18 h
Filament temperature: 2200° C.

A diamond coating of 20–25 μm thickness was obtained.

EXAMPLE 3

In a percussive drilling test in a quartzite quarry, the penetration rate and the life of bits with buttons according to the invention were compared to bits of prior art. The bit had a special and strong construction for use in very hard rocks (Heavy Duty Design) with six buttons on the periphery according to the following:

Bit A: Buttons according to the invention from Example 1

Bit B: Buttons according to the invention from Example 2

Bit C: Coated comparative buttons of Example 1

Bit D: Uncoated buttons corresponding to bits A and B

Bit E: Uncoated buttons corresponding to Bit C

Test Data:
Application: Bench drilling in very abrasive quartzite
Rock drilling: COP 1036
Drilling rig: ROC 712
Impact pressure: 190 bar
Stroke position: 3
Feed pressure: 70–80 bar
Rotation pressure: 60 bar
Rotation: 120 r.p.m.
Air pressure: 4.5 bar
Hole depth: 6–18 m Results

| Bit | Number of Bits | Average Life, m | Average penetration, m per minute | |
|---|---|---|---|---|
| A | 2 | 436 | 1.5 | |
| B | 2 | 405 | 1.5 | |
| C | 2 | 280 | 1.3 | prior art |
| D | 2 | 180 | 1.2 | prior art |
| E | 2 | 130 | 1.1 | prior art |

The average life of Bit C was limited because of premature flaking.

EXAMPLE 4

A diamond coating was deposited directly on buttons for rotary crushing rock drilling. The nominal composition of the buttons was 10% Co and 90% WC. The buttons had an eta-phase-containing core surrounded by a surface zone free of eta-phase with a low cobalt content (5%) at the surface and a higher Co-content in a zone close to the eta-phase core. For comparative purposes, buttons with the same nominal composition with homogeneous structure and no eta-phase were also coated. The buttons were pretreated by immersion in an ultrasonic 1 µm diamond slurry for 30 minutes in order to enhance nucleation during diamond deposition. A 1.5 kW microwave plasma CVD reactor was used with an independent heating stage. The deposition conditions were as follows:

Gas composition: 2% methane in hydrogen

Pressure: 30 Torr

Gas Flow rate: 1000 ml/min

Substrate temperature: 805° C.

Deposition time: 24 h

A microcrystalline coating of 18–24 µm thickness was obtained. Raman spectroscopy revealed that the coating had a strong 1332 cm−1 peak in spite of its microcrystalline appearance.

EXAMPLE 5

A wear test was performed with roller bits in an open-cut copper mine. The roller bits were of type 9⅞" CS with spherical buttons. The diameter of all of the buttons was 12 mm. For one roller bit, the buttons according to the invention were placed in each third position of the buttons in row 1. Three types of roller bits were used in the test:

Bit A: Buttons according to Example 4 were placed as above and, in the excepted positions in row 1, uncoated buttons corresponding to Example 4 were placed. In all other positions, comparative buttons of Example 4 were placed.

Bit B: Comparative buttons of Example 4 were placed in all positions.

Bit C: Uncoated buttons, corresponding to Example 4, were placed in row 1, and comparative buttons of Example 4 were placed in all other rows.

The wear was measured of all buttons after 800 BM. The drilling data were as follows:

Drill rig: 2 pieces BE45R

Feed: 50,000–60,000 lbs

RPM: 60–85

Hole depth: 18–20 m

Type of rock: Biotit gneiss, mica schist

Results

| Bit A | Row 1 | Buttons according to the invention: no measurable wear but one button was missing, no flaking |
| | | Uncoated buttons: Average wear: 1.9 mm |
| | Row 2 | Average wear: 2.4 mm |
| | Row 3 | Average wear: 2.1 mm |
| | | Average penetration: 21 m/h |
| Bit B | Row 1 | Average wear: 3.2 mm |
| | Row 2 | Average wear: 2.8 mm |
| | Row 3 | Average wear: 2.4 mm |
| | | Average penetration: 16 m/h |
| Bit C | Row 1 | Average wear: 2.6 |
| | Row 2 | Average wear: 2.3 mm |
| | Row 3 | Average wear: 2.1 mm |
| | | Average penetration: 18 m/h |

It is obvious that the wear resistance of the buttons is much improved using diamond coated cemented carbide according to the invention.

EXAMPLE 6

A diamond coating was deposited directly on buttons for highway engineering. The nominal composition of the buttons was 10% Co and 90% WC, and with an eta-phase containing core surrounded by a surface zone free of eta-phase with a low cobalt content (5%) at the surface and a higher Co-content close to the eta-phase core. For comparative purposes, buttons with the same nominal composition with homogeneous structure and no eta-phase were also coated. The buttons were pretreated by immersion in an ultrasonic 1 µm diamond slurry for 30 minutes in order to enhance nucleation during diamond deposition. A 1.5 kW microwave plasma CVD reactor was used with an independent heating stage. The deposition conditions were as follows:

Gas composition: 4% methane and 1.7% oxygen in hydrogen

Pressure: 40 Torr

Gas flow rate: 2000 ml/min

Substrate temperature: 885° C.

Deposition time: 16 h

A nicely faceted, crystalline coating of 15–18 µm thickness was obtained. Raman spectroscopy revealed that the coating had a strong 1332 cm−1 peak in spite of the high methane concentration used. The oxygen addition also had a positive effect on growth rate. The coating adhered well to the substrate.

EXAMPLE 7

In a cutting performance/wear behavior test in the branch of highway engineering, 800 m² of asphalt was milled without preheating. The test was performed with three different grades of cutting tips under the following conditions:

Machine: Arrow CP 2000 road planing machine. The machine was four-wheel driven, hydraulic and equipped with automatic control system of the cutting depth.

Data of the cutting drum:

Width: 2 m

Diameter including tools: 0.95 m

Tool speed: 3.8 m/s

Cutting depth: 80 mm

During the test, 60 tools of the totally 166 tools around the drum were test variants. 20 tools of each grade were placed in pairs uniformly distributed around the drum.

All of the tips had a height of 17 mm and a diameter of 16 mm. If test tip or normal tip failed, the tool was replaced immediately by a standard tool of a conventional grade.

Results

| | | Number of Tools |
|---|---|---|
| Type 1 | Cutting tips according to Example 6 | 20 |
| | Average wear: 1.1 mm | |
| | Two replaced | |
| Type 2 | Uncoated cutting tips according to Example 6 | 20 |
| | Average wear: 3.2 mm | |
| | Three replaced | |

-continued

| | | Number of Tools |
|---|---|---|
| Type 3 | Comparative tips of Example 6 with a nominal content of 10% Co Average wear: 4.8 mm Six replaced | 20 |
| Type 4 | Conventional tools with 9.5% Co No measurements were made on these tools | 106 |

The results of type 1 were uneven because eight of the tools had undamaged diamond layers. Two had lost the tips due to the weariness of the steel body. The rest of the tools were partly covered with diamond after the test. Undoubtedly, the cutting tips according to the invention have shown the best results.

EXAMPLE 8

A diamond coating was deposited on cemented carbide buttons used for percussive rock drilling with an eta-phase core using the experimental conditions described in Example 1, with the exception that $WF_6$ was introduced in the reactor for 15 minutes after 8, 16, 24 and 32 hours at a concentration of 1.6%. This resulted in well adherent diamond coating of 35–40 μm thickness with four thin interlayers of $WC/WC_x$ and a reduced grain size as compared to Example 1.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method of coating a cemented carbide body for rock drilling having a substrate containing at least one metal carbide and a binder metal, the body including a core containing eta-phase and a surface zone free of eta-phase, the method comprising:
   heat treating the substrate such that the cemented carbide body includes a zone of compressive stresses; and
   depositing a coating comprising at least one diamond- or cBN-layer on the zone of compressive stresses by CVD- or PVD- methods.

2. The method of claim 1, wherein the binder metal content in a zone close to the eta-phase containing core is higher than the nominal binder metal content of the substrate after the heat treating.

3. The method of claim 1, the binder metal content in the surface of the body is 0.1–0.9 of the nominal binder metal content after the heat treating.

4. The method of claim 1, wherein the coating is diamond applied by CVD-method.

5. The method of claim 1, wherein a non-diamond layer is interposed between the substrate and the diamond- or cBN- layer to increase the adhesion of the diamond- or cBN-layer to the substrate.

6. The method of claim 5, wherein the non-diamond layer is a layer of a refractory metal.

7. The method of claim 6, wherein the refractory metal is tungsten.

8. The method of claim 1, wherein the coating contains more than one layer of diamond or cBN.

9. The method of claim 8, wherein a non-diamond layer is interposed between each layer of diamond or cBN.

10. The method of claim 1, further comprising a step of removing the binder metal in the surface zone of the cemented carbide body prior to depositing the coating.

11. The method of claim 1, the surface zone is free of the binder metal after the heating treating.

12. The method of claim 1, further comprising shaping the substrate such that the cemented carbide body comprises a percussion type bit.

13. The method of claim 1, further comprising shaping the substrate such that the cemented body comprises a roller cone type bit.

14. The method of claim 1, wherein the coating is applied by a low pressure technique.

15. The method of claim 1, wherein the coating is applied by a low pressure technique at a pressure no greater than 40 Torr.

16. The method of claim 1, wherein the coating is deposited at a temperature no greater than 885° C.

17. The method of claim 1, wherein the coating is deposited in a furnace at a temperature no greater than 885° C. and at a pressure no greater than 40 Torr.

* * * * *